(12) United States Patent
Chang

(10) Patent No.: US 7,094,662 B2
(45) Date of Patent: Aug. 22, 2006

(54) OVERLAY MARK AND METHOD OF FABRICATING THE SAME

(76) Inventor: Ching-Yu Chang, No. 17, 6 Lin, Hsin-Cheng Rd., Tung-Le Tsun, Yuan-Shan Hsiang, Yilan Hsien, Yilan Hsien (TW)

( * ) Notice: Subject to any disclaimer, the term of this patent is extended or adjusted under 35 U.S.C. 154(b) by 87 days.

(21) Appl. No.: 10/710,637

(22) Filed: Jul. 27, 2004

(65) Prior Publication Data

US 2005/0074945 A1  Apr. 7, 2005

(30) Foreign Application Priority Data

Oct. 6, 2003  (TW) .............................. 92127630 A

(51) Int. Cl.
*H01L 21/76* (2006.01)
(52) U.S. Cl. .................. 438/401; 438/462; 438/975
(58) Field of Classification Search ................ 438/401, 438/424, 427, 692, 700, 703, 975
See application file for complete search history.

(56) References Cited

U.S. PATENT DOCUMENTS

| | | | | |
|---|---|---|---|---|
| 5,858,854 A | * | 1/1999 | Tsai et al. ................... | 438/401 |
| 5,889,335 A | * | 3/1999 | Kuroi et al. ................. | 257/797 |
| 6,080,659 A | * | 6/2000 | Chen et al. .................. | 438/633 |
| 6,136,662 A | * | 10/2000 | Allman et al. ............... | 438/401 |
| 6,153,492 A | * | 11/2000 | Wege et al. ................. | 438/401 |
| 6,232,200 B1 | * | 5/2001 | Chu ........................... | 438/401 |
| 6,291,870 B1 | * | 9/2001 | Kawashima et al. ........ | 257/510 |
| 6,303,458 B1 | * | 10/2001 | Zhang et al. ................ | 438/401 |
| 6,635,567 B1 | * | 10/2003 | Ebertseder et al. ......... | 438/638 |
| 6,803,291 B1 | * | 10/2004 | Fu et al. ...................... | 438/401 |
| 6,809,420 B1 | * | 10/2004 | Wong ......................... | 257/773 |

\* cited by examiner

*Primary Examiner*—Zandra V. Smith
*Assistant Examiner*—Khanh Duong
(74) *Attorney, Agent, or Firm*—Jianq Chyun IP Office

(57) ABSTRACT

A method of forming an overlay mark is provided. A first material layer is formed on a substrate, and then a first trench serving as a trench type outer mark is formed in the first material layer. The first trench is partially filled with the first deposition layer. A second material is formed over the first trench and the first deposition layer. A second trench is formed exposing the first deposition layer within the first trench. The second trench is partially filled with a second deposition layer forming a third trench. A third material layer is formed on the substrate to cover the second deposition layer and the second material layer. A step height is formed on the third deposition layer between the edge of the first trench and the center of the first trench. A raised feature serving as an inner mark is formed on the third deposition layer.

12 Claims, 11 Drawing Sheets

OVERLAY MARK AND METHOD OF FABRICATING THE SAME

CROSS REFERENCE TO RELATED APPLICATIONS

This application claims the priority benefit of Taiwan application serial no. 92127630, filed Oct. 6, 2003.

BACKGROUND OF INVENTION

1. Field of the Invention

The invention relates to an overlay mark and a method of fabricating the same, capable of solving the problem of alignment measurement caused by low step height of the outer mark.

2. Description of the Related Art

In addition to the control of critical dimension (CD), factors for a successful photolithography process on a wafer include alignment accuracy (AA). Therefore, the measurement of accuracy, that is, the measurement of overlay error is crucial to the semiconductor fabrication process. An overlay mark is used as a tool for measuring overlay error and to determine whether the photoresist pattern is precisely aligned with the previous wafer layer on a wafer after a photolithography process.

Conventionally, the overlay marks are located on the corners of the edge of each chip to measure whether the photoresist pattern is aligned with the previous wafer layer in the fabrication process.

FIGS. 1A to 1C are cross sectional views illustrating a method of fabricating a metal interconnect having a via (via 0) and an overlay mark. Referring to FIG. 1, a substrate 100 is provided, wherein the substrate 100 includes a chip region 102 and an overlay mark region 104. The dielectric layer 106a is formed on the substrate 100, and then the dielectric layer 106a is patterned to form a contact hole 108 in the dielectric layer 106a on the chip region 102. The subsequent process is another contact formation step, rather than a wire line forming step, so that no overlay mark is formed in the dielectric layer 106a on the overlay mark region 104.

As shown in FIG. 1A, the contact hole 108 is filled with tungsten 107a, and then a dielectric layer 110a is formed on the dielectric layer 106a. Thereafter, the dielectric layer 110a is patterned to form a via hole (via 0) in the dielectric layer 110a on the chip region 102 and a trench 114 in the dielectric layer 110a on the overlay mark region 104 simultaneously, wherein the trench 114 serves as a outer mark. Subsequently, a tungsten layer 116 is formed on the dielectric layer 110a to fill into the via hole and trench 114.

Referring to FIG. 1B, a chemical mechanical polishing process is performed on the tungsten layer 116 (in FIG. 1A) until the dielectric layer 110a is exposed to form a via (via 0) 112 on the chip region 102 and leave tungsten layer 116a in the trench 114 on the overlay mark region 104.

Referring to FIG. 1C, a metal layer 118 is formed on the substrate 100 for forming wire lines. A patterned photoresist layer 120 is formed on the metal layer 118. The portion of the patterned photoresist layer 120 on the chip region 102 serves as a mask for defining wire lines, and the other portion of the patterned photoresist layer 120a on the overlay mark region 104 serves as inner mark.

In general, the dielectric layer 110a used for forming via hole (via 0) is thinner than the dielectric layer 106a, so that the trench 114 is mostly filled with the metal layer 116a after performing the chemical mechanic polishing process. Therefore, when the overlay mark is used to measure the alignment accuracy, the peak signal t of the outer mark can not be read because of low step height on the outer mark. Consequently, the overlay error can not be calculated.

SUMMARY OF INVENTION

The invention provides an overlay mark and a method of fabricating the same to solve the problem of alignment measurement caused by low step height of the outer mark.

The invention provides a method of fabricating an overlay mark. A first material layer is formed on a substrate, and then a first trench serving as a trench type outer mark is formed in the first material layer. Thereafter, a first deposition layer is formed on the first material layer, wherein the first trench is partially or incompletely filled with the first deposition layer. Subsequently, a first chemical mechanical polishing process is performed on the first deposition layer until the first material layer is exposed leaving the remaining first deposition layer in the first trench. A second material layer is formed to cover the first material layer and the first deposition layer. A portion of the second material layer on the trench type outer mark is removed to form a second trench, wherein the second trench exposes at least a portion of the first deposition layer in the first trench. A second deposition layer is formed on the substrate, and then a second chemical mechanical polishing process is performed on the second deposition layer until the first material layer is exposed leaving the remaining portion of the second deposition layer in the second trench. A third deposition layer is formed on the second material layer and the second deposition layer. The first trench is partially or incompletely filled with the first deposition layer, so that a step height is formed on the third deposition between the edge of the first trench and the center of the first trench. A raised feature serving as an inner mark is formed on the third deposition layer.

The invention further provides a method of fabricating an overlay mark. A first material layer is formed on a substrate, and the first material layer is patterned to form a first raised feature serving as a portion of a raised type outer mark on the substrate. Subsequently, a first deposition layer is formed to cover the substrate and the first raised feature, and then a first chemical mechanical polishing process is performed on the first deposition layer until the top surface of the first raised feature is exposed. Thereafter, a second material layer is formed to cover the first deposition layer and the first raised feature, wherein a thickness of the second material layer is smaller than that of the first material layer. The second material layer is patterned to form a second raised feature serving as the other portion of the raised type outer mark on the first raised feature. Afterwards, a second deposition layer is formed to cover the first deposition layer, the second raised feature and the first deposition layer. The second deposition layer is thinner than the second feature. Subsequently, a second chemical mechanical polishing process is performed on the second deposition layer until the top surface of the second raised feature is exposed. Thereafter, a third deposition layer is formed on the second material layer. A step height is formed on the third deposition layer between the edge of the second raised feature and the center of the second raised feature. Subsequently, the third raised feature serving as an inner mark layer is formed on the third deposition layer.

The invention further provides an overlay mark. The overlay mark comprises a first material, a first deposition layer, a second material layer, a second deposition layer, a third deposition layer and a raised feature. The first material layer having a first trench therein serves as a portion of a trench type outer mark. The first trench is partially or incompletely filled with the first deposition layer. The second material layer having a second trench therein serving as the other portion of the trench type outer mark, wherein a thickness of the second material layer is smaller than that of the first material layer and the second trench exposes at least a portion of the first deposition layer in the first trench. The second trench is partially or incompletely filled with the second deposition layer. The third deposition layer covers the second material and the second deposition layer. A step height is formed between the third deposition layer on the edge of the first trench and the third deposition layer on the center of the first trench, because the first trench and the second trench are partially or incompletely filled with the first deposition layer and the second deposition, respectively. The raised feature made of a patterned photoresist layer located on the third deposition layer to serves as an inner mark.

The invention further provides an overlay mark. The overlay mark comprises a first raised feature, a first deposition layer, a second raised feature, a second deposition layer, a third deposition layer and a third raised feature. The first raised feature serving as a portion of a raised type outer mark is on a substrate. The first deposition layer covers a side wall of the first raised feature and the substrate. The top surface of the first deposition layer on the substrate is lower than that of the first raised feature. The second raised feature serving as the other portion of the raised type outer mark covers the first raised feature, wherein a thickness of the second raised feature is smaller than that of the first raised feature. The second deposition layer covers a side wall of the first feature and the first deposition layer. The third deposition layer covers the second raised feature and the second deposition layer. A step height is formed on the third deposition layer between the edge of the second raised feature and the center of the second raised feature. The third raised feature made of a patterned photoresist layer is on the third deposition layer and serves as an inner mark.

Since the outer mark has enough step height, the peak signal of the outer mark can be read. Therefore, the overlay error can be calculated.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

In the overlay mark of this invention and the method of fabricating the same, the step height of the outer mark is increased, so that the peak signal of the outer mark can be read. Therefore, the overlay error can be calculated. The following detail description relating to the method of fabricating an overlay mark in a metal interconnect process are exemplary and explanatory only and are not restrictive of the invention. Other embodiments of this invention will appear to those skilled in the art from consideration of the specification and practice of the invention disclosed herein.

Figure 1A:
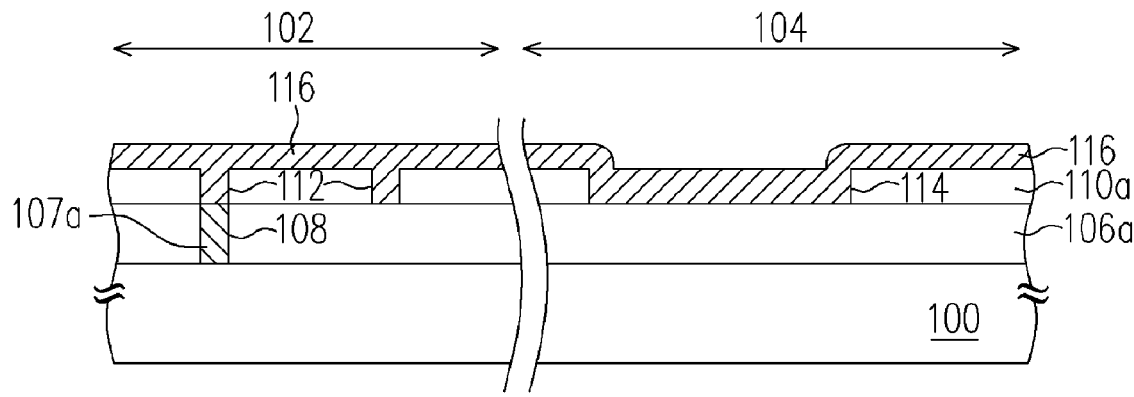
FIGS. 1A to 1C are cross sectional views illustrating a method of fabricating a metal interconnect having a via (via 0) and an overlay mark according to the prior art.
Figure 1B:
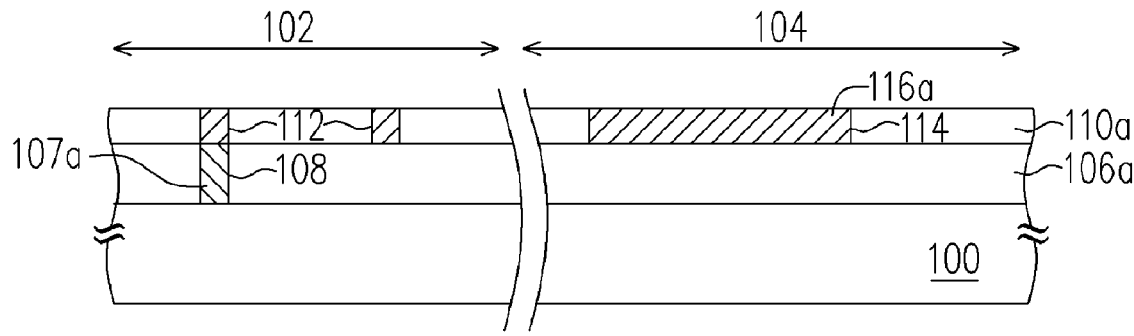
Figure 1C:
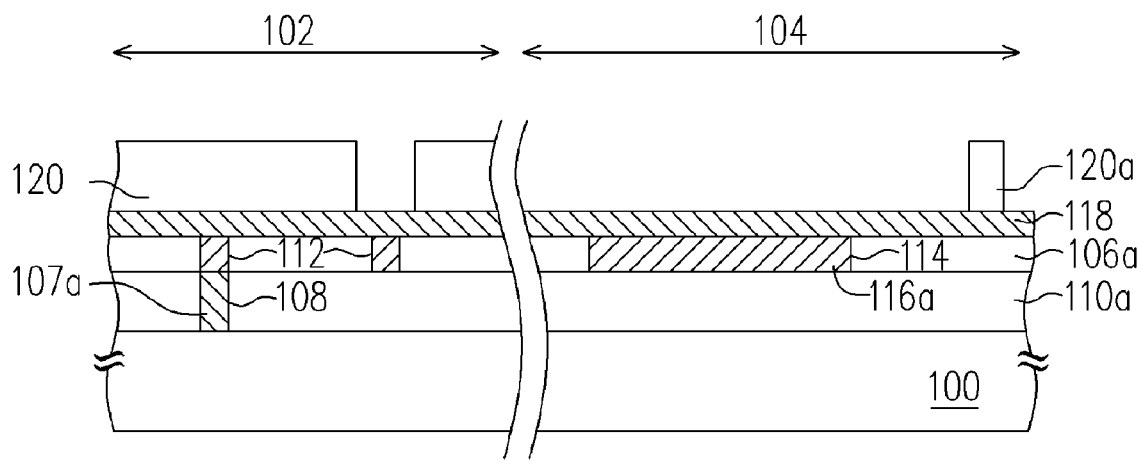

FIGS. 2A to 2J are cross sectional views illustrating a method of fabricating an overlay mark in a metal interconnect according to the first embodiment of this invention, which only show the overlay mark region in the wafer similar to the overlay mark region 104 in FIGS. 1A to 1C.

Figure 2A:
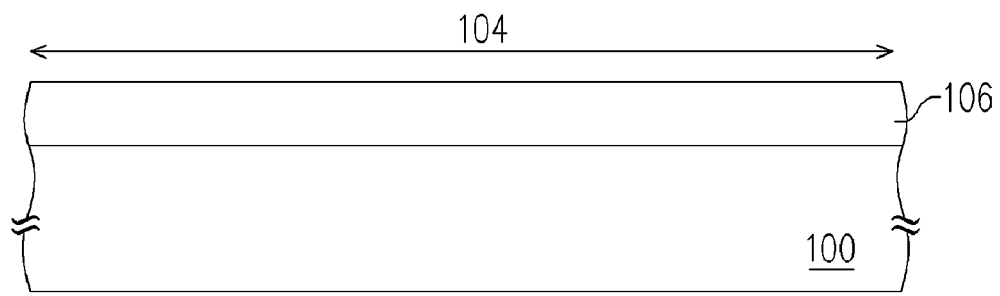
FIGS. 2A to 2J are cross sectional views illustrating a method of fabricating an overlay mark in a metal interconnect according to the first embodiment of this invention.
Figure 2B:
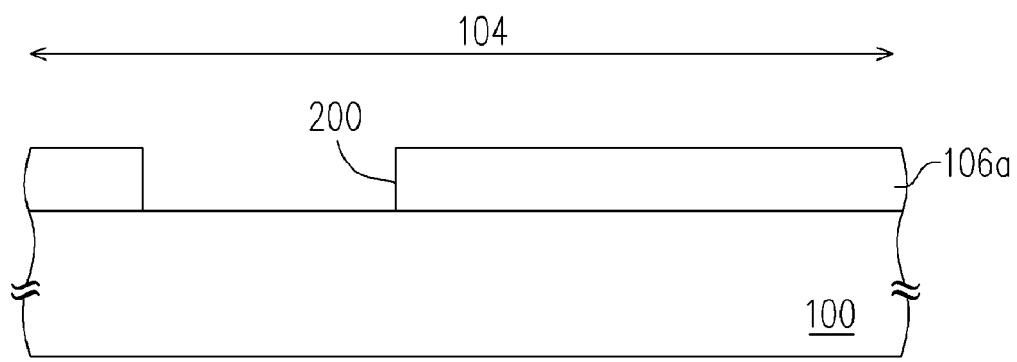

Referring to FIG. 2A, in the metal interconnect process, a dielectric layer 106 is first formed on the substrate 100. Referring to FIG. 2B, a photolithographic process and an etching process for patterning the dielectric layer 106 are conducted to form a patterned dielectric layer 106a. The portion of patterned dielectric layer 106a on the chip region of the substrate 100 has a contact hole therein (not shown), and the portion of the patterned dielectric layer 106a on the overlay mark region 104 has a trench 200 therein. The trench 200 serves as a portion of an outer mark. In an embodiment, the trench 200 consists of four trenches, and the four trenches enclose a rectangle, and the width of the trench 200 is larger than that of the contact hole on the chip region.

Figure 2C:
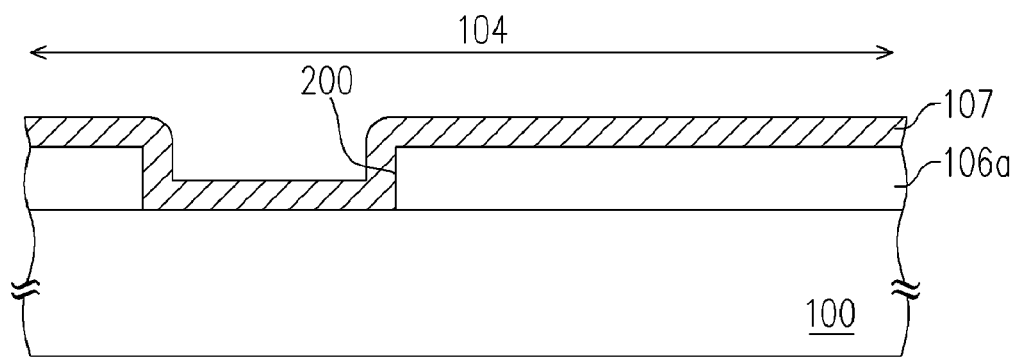

Referring to FIG. 2C, a metal layer 107 such as a tungsten layer is formed on the patterned dielectric layer 106a to fill in the contact hole and the trench 200. In general, the metal layer 107 is thinner than that of the dielectric layer 106a. Because the width of the trench 200 is larger than that of the contact hole, the trench 200 is partially or incompletely filled with the metal layer 107 when the contact hole is filled with the metal layer. In other words, a step height is formed on the metal layer 107 between the edge of the trench 200 and the center of the trench 200.

Figure 2D:
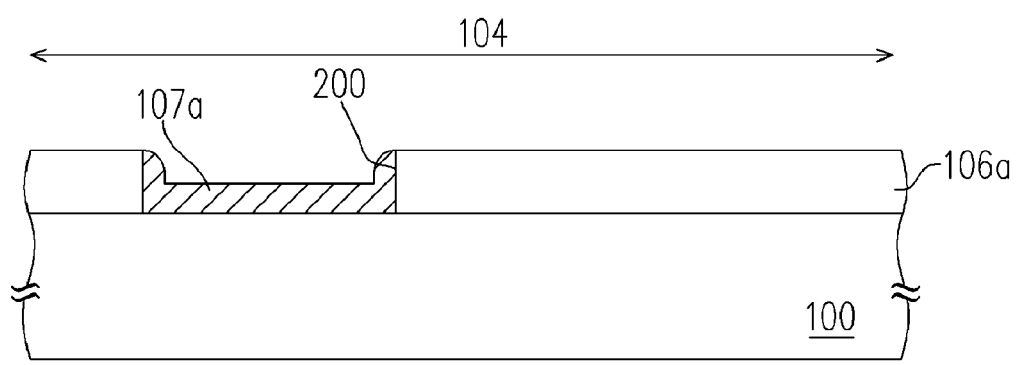

Referring to FIG. 2D, a chemical mechanical polishing process is performed on the metal layer 107 until the patterned dielectric layer 106a is exposed to form a contact plug (not shown) on the chip region and leave the remaining metal layer 107a in the trench 200. The metal layer 107a left in the trench 200 retains the step height.

Figure 2E:
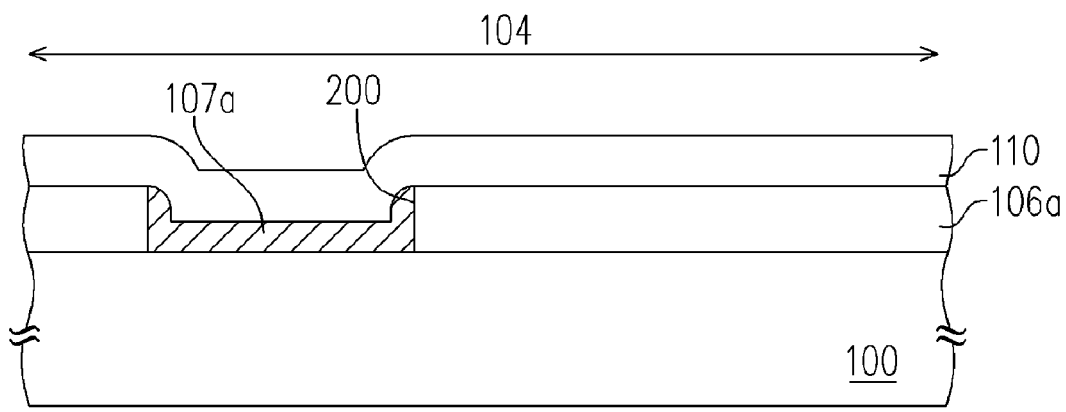

Thereafter, referring to FIG. 2E, another dielectric layer 110 is formed on the patterned dielectric layer 106a, in which a via will be formed therein in the subsequently process. In general, the dielectric layer 110 is thinner than the dielectric layer 106a. The thickness of the dielectric layer 106a is, for example, about 8000 angstrom, and the thickness of the dielectric layer 110 is about 3000 angstrom.

Figure 2F:
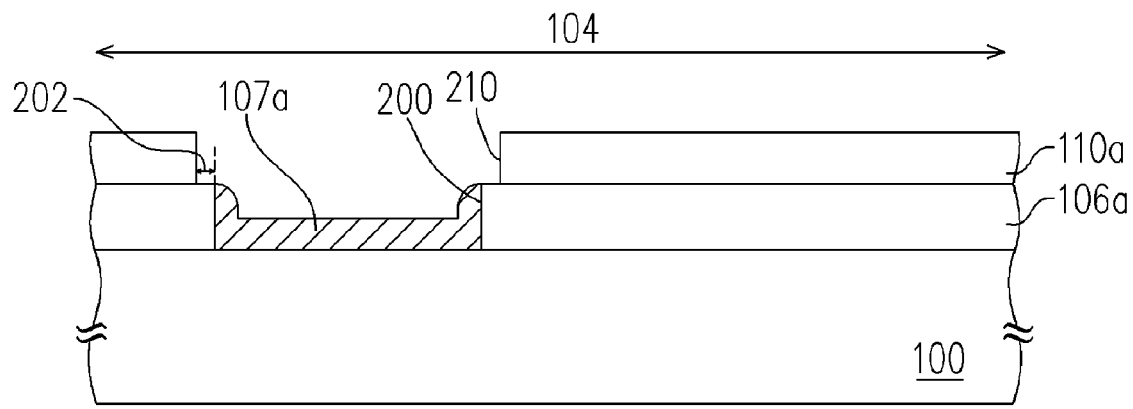

Referring to FIG. 2F, a photolithographic process and an etching process for patterning the dielectric layer 110 are conducted to form a patterned dielectric layer 110a. The portion of patterned dielectric layer 110a on the chip region of the substrate 100 has a via hole therein (not shown). The portion of the patterned dielectric layer 110a on the overlay mark region 104 has a trench 210 therein, wherein the trench 210 serves as the other portion of the outer mark. The width of the trench 210 is larger than that of the trench 200, and the trench 210 exposes the metal layer 107a in the trench 200 and a portion of the patterned dielectric layer 106a. The difference in distance 202 between a side wall of the trench 210 and that of the trench 200 is no less than 150 nm.

Figure 2G:
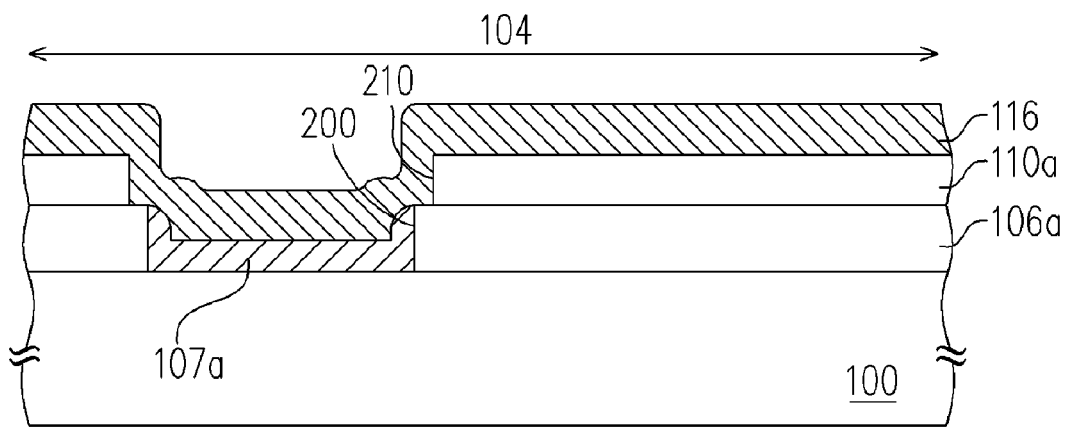

Subsequently, referring to FIG. 2G, another metal layer 116 such as a tungsten layer is formed to cover the dielectric layer 110a and fill in the via hole on the chip region and fill in the trench 210 on the overlay mark region 104. When the thickness of the second metal layer 116 is similar to that of the second dielectric layer 110, the trench 210 is partially or incompletely filled with the metal layer 116, because the trench 200 is partially or incompletely filled with the metal layer 107. In other words, the step height is maintained in the metal layer 116 between the edge of the trench 200 and the center of the trench 200.

Figure 2H:
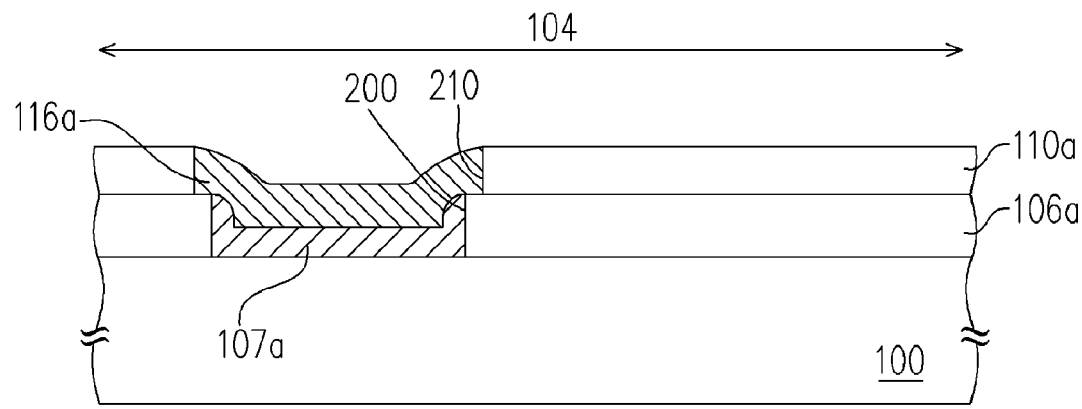

Referring to FIG. 2H, a chemical mechanical polishing process to the metal layer 116 is performed until the patterned dielectric layer 110a is exposed to form a via plug (not shown) on the chip region and leave the metal layer 116a in the trench 210 on the overlay mark region 104. The metal layer 116a left in the trench 210 keeps the step height of the metal layer 107a when the thickness of the metal layer 116 is similar to that of the dielectric layer 110a.

Figure 2I:
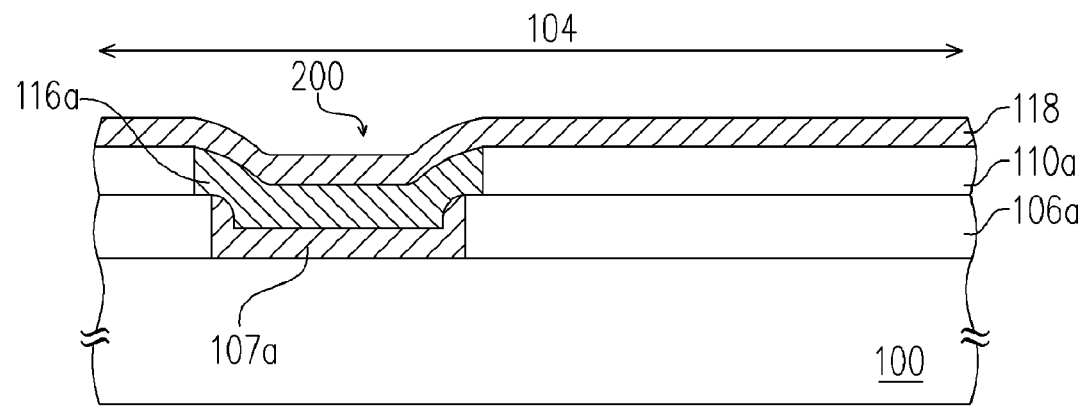
Figure 2J:
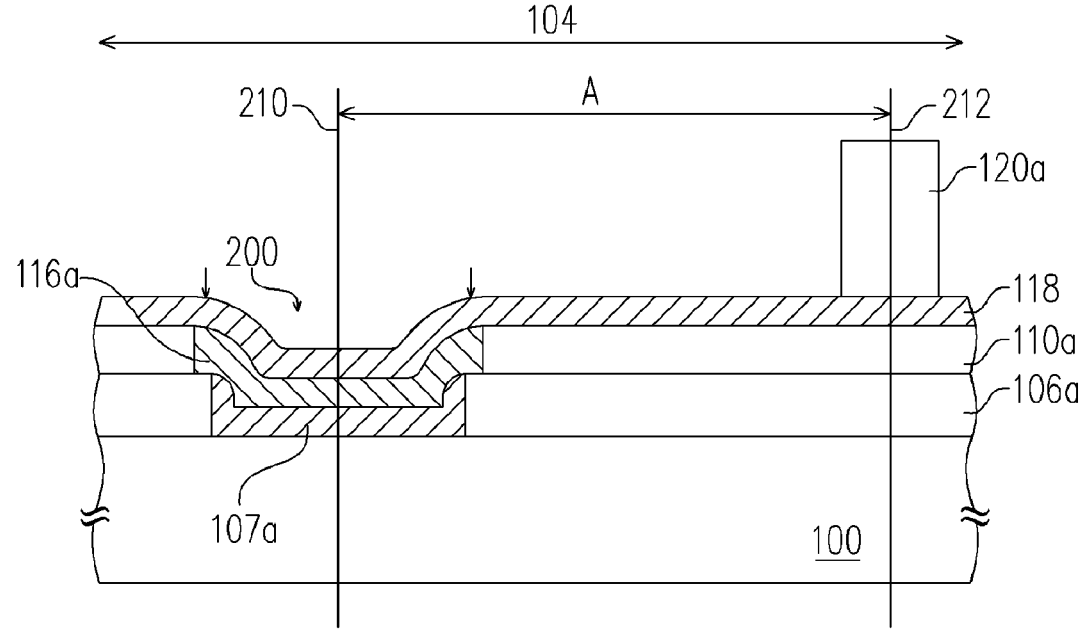

Referring to FIG. 2I, a metal layer 118 used for forming wire lines connected to the via plug on the chip region is formed on the dielectric layer 110a. Referring to FIG. 2J, a patterned photoresist layer 120 is formed on the metal layer 118. The portion of the patterned photoresist layer 120 on the chip region serves as a mask for defining wire lines, and the portion 120a of the patterned photoresist layer on the overlay mark region 104 serves as an inner mark.

Again, referring to FIG. 2J, the step height is formed on the metal layer 118 between the edge of the trench 200 and the center of the trench 200, because the trenches 200 and 210 are partially or incompletely filled with the first deposition layer and the second deposition, respectively. Using the overlay mark to measure the alignment accuracy, the peak signal in the center point of the outer mark, which is indicated by the dotted line 210, can be read, since the outer mark has a high step height. Moreover, the peak signal in the center point of the inner mark, which is indicated by the dotted line 212, can be read. Thereafter, the overlay error can be determined. For example, the overlay error can be decided by the difference in distance A between the peak signal in the center point of the outer mark and the peak signal in the center point of the inner mark.

Figure 3A:
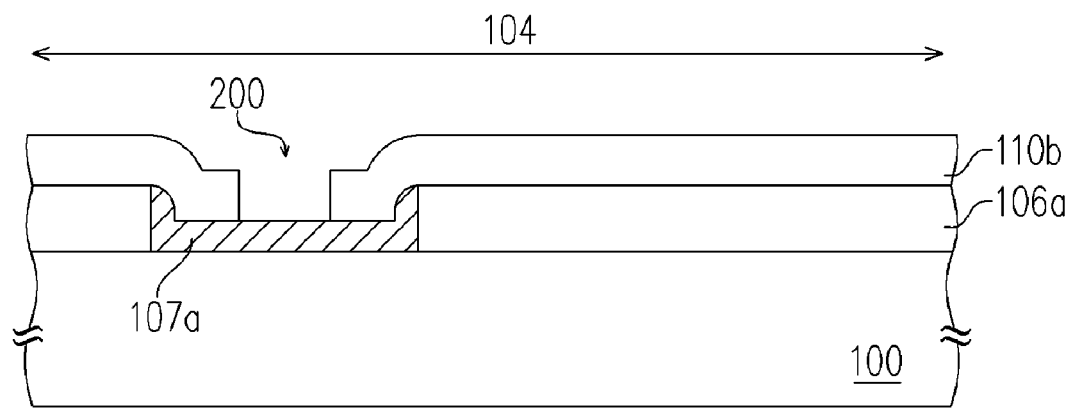
FIGS. 3A to 3D are cross sectional views illustrating a method of fabricating an overlay mark in a metal interconnect according to the second example of the first embodiment of this invention.

Another example of the first embodiment of the present invention is described as follows. FIG. 3A is a cross sectional view illustrating a method of fabricating an overlay mark in a metal interconnect according to the first embodiment of this invention, which is a subsequent step following FIG. 2E. Referring to FIG. 3A, a photolithographic process and an etching process for patterning the dielectric layer 110 are conducted to form a patterned dielectric layer 110b. The portion of patterned dielectric layer 110b on the chip region of the substrate 100 has a via hole therein (not shown). The portion of the patterned dielectric layer 110b on the overlay mark region 104 has a trench 210a therein, the trench 210a serves as the other portion of the outer mark. The width of the trench 210a is smaller than that of the trench 200, and the trench 210a exposes a portion of the metal layer 107a in the trench 200.

Figure 3B:
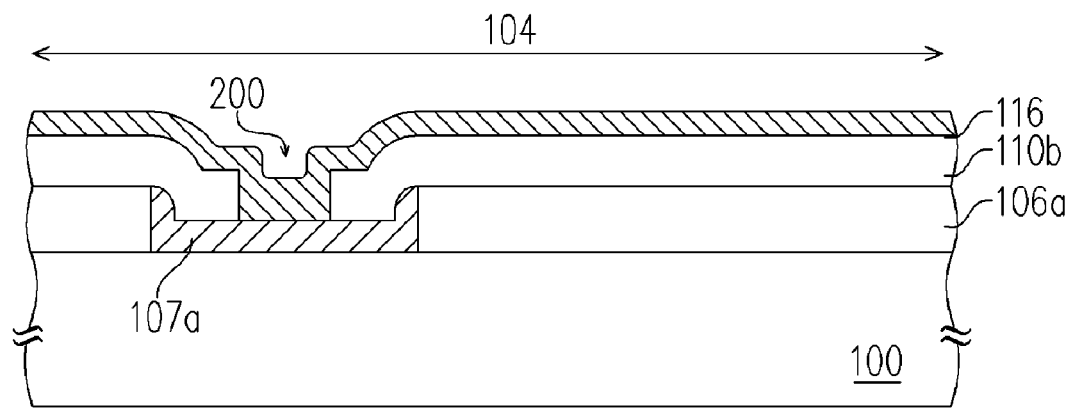
Figure 3C:
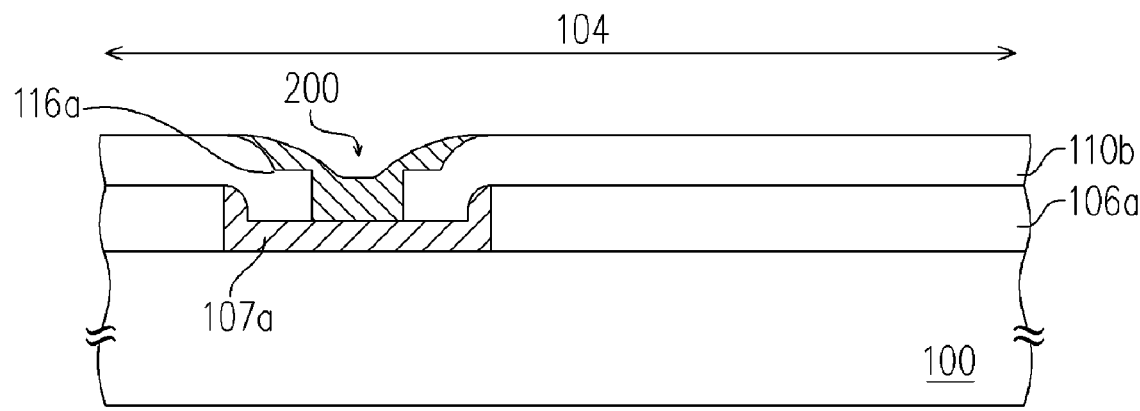

Referring to FIG. 3B, another metal layer 116 such as a tungsten layer is formed to cover the dielectric layer 110b and fill into the trench 210a. Thereafter, a chemical mechanical polishing process is performed on the metal layer 116 until the dielectric layer 110b adjacent the trench 200 is exposed. Thereby, a via plug (not shown) on the chip region is formed and the metal layer 116a over the metal layer 107a remain on the overlay mark region 104. The metal layer 116a retains the step height of the metal layer 107a when the thickness of the metal layer 116 is similar to that of the dielectric layer 110a.

Subsequently, referring to FIG. 3D, a metal layer 118 used for forming wire lines connected to the via plug on the chip region is formed on the dielectric layer 110b. Thereafter, a patterned photoresist layer 120 is formed on the metal layer 118. The portion (not shown) of the patterned photoresist layer 120 on the chip region serves as a mask for defining wire lines, and the portion 120a of the patterned photoresist layer 120 on the overlay mark region 104 serves as an inner mark.

Figure 3D:
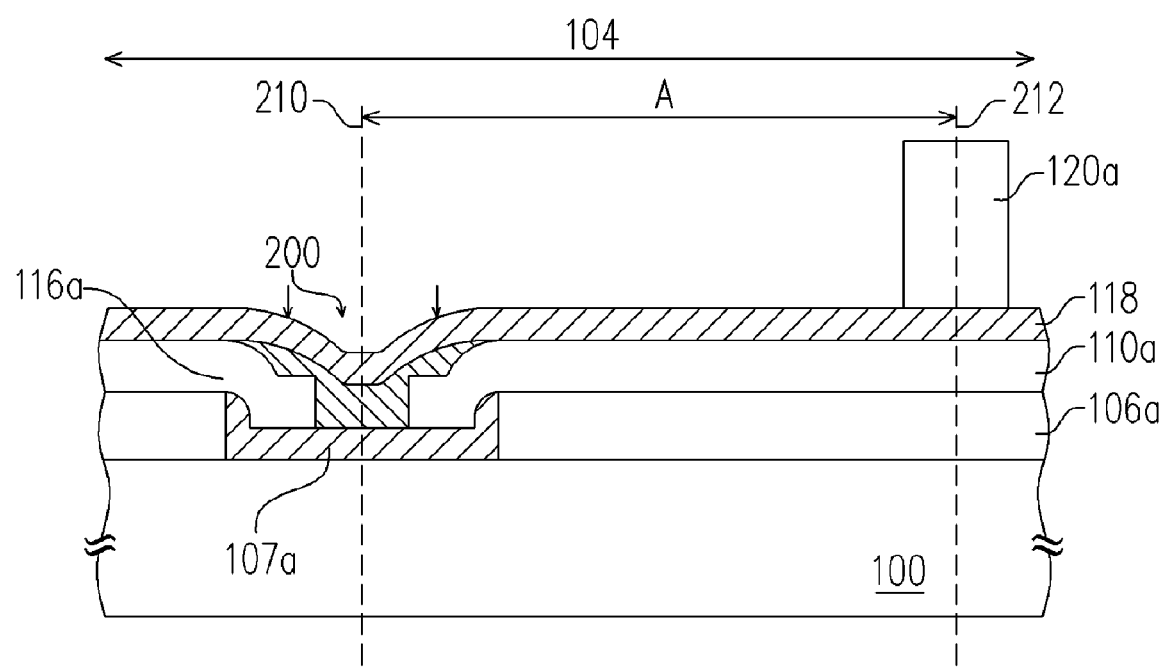

Referring to FIGS. 2J and 3D, the overlay mark of this embodiment comprises a dielectric layer 106a, a metal layer 107a, a dielectric layer 110a or a dielectric layer 110b, a metal layer 116a, a metal layer 118 and a raised feature 120a. The dielectric layer 106a having a first trench 200 therein serves as a portion of the trench type outer mark. The first trench 200 is partially or incompletely filled with the metal layer 116a. A thickness of the dielectric layer 110a or 110b having a second trench 210 or 210a therein is smaller than that of the dielectric layer 106a. Therefore, the second trench 210 or 210a exposes at least a portion of the metal layer 107a in the first trench 200. The second trench 210 or 210a is partially or incompletely filled with the metal layer 116a, wherein the second trench 210 or 210a serves as the other portion of the trench type outer mark. The metal layer 118 covers the dielectric layer 110a or 110b and the metal layer 116a. A high step height is formed on the metal layer 118 between the edge of the first trench 200 and the center of the first trench 200, because the first trench 200 and the second trench 210 are partially or incompletely filled with the metal layer 107a and metal layer 116a, respectively. The raised feature 120a made of a patterned photoresist layer located on the metal layer 118 serves as an inner mark. Using the overlay mark to measure the alignment accuracy, the peak signal in the center point of the outer mark, which is indicated by the dotted line 210, can be read, since the outer mark has a high step height. Moreover, the peak signal in the center point of the inner mark, which is indicated by the dotted line 212, can be read. Thereafter, the overlay error can be determined.

In the first embodiment, the trench type outer mark is provided for forming the outer mark of the overly mark. On the other hand, a raised type outer mark is provided for forming the outer mark of the overly mark.

Figure 4A:
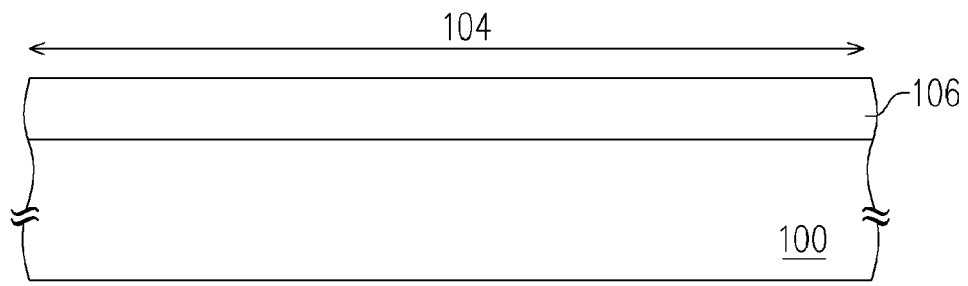
FIGS. 4A to 4I are cross sectional views illustrating a method of fabricating an overlay mark in a metal interconnect according to the second embodiment of this invention.
Figure 4B:
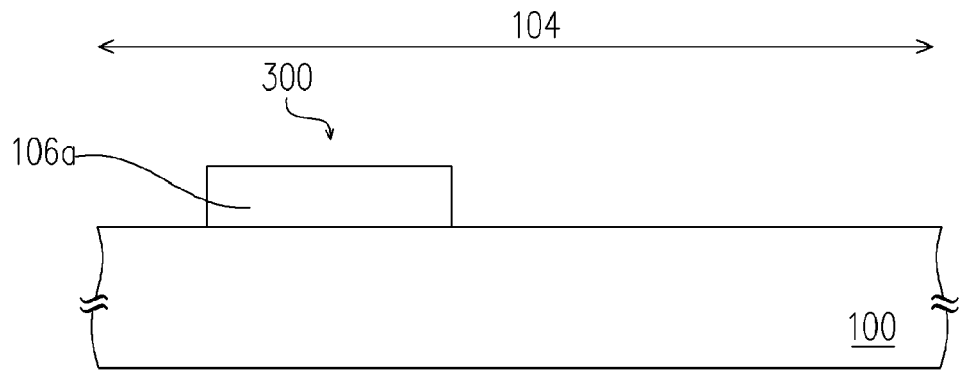

FIGS. 4A to 4I are cross sectional views illustrating a method of fabricating an overlay mark in a metal interconnect according to the second embodiment of this invention. Referring to FIG. 4A, in the metal interconnect process, a dielectric layer 106 is first formed on the substrate 100. Referring to FIG. 4B, a photolithographic process and an etching process for patterning the dielectric layer 106 are conducted to form a patterned dielectric layer 106a. The portion of patterned dielectric layer 106a on the chip region of the substrate 100 has a contact hole therein (not shown), and the portion of the patterned dielectric layer on the overlay mark region 104 is a first raised feature 300. The first raised feature 300 serves as a portion of an outer mark. In an embodiment, the first raised feature 300 consists of four protrusions, and the four protrusions enclose a rectangle (not shown).

Figure 4C:
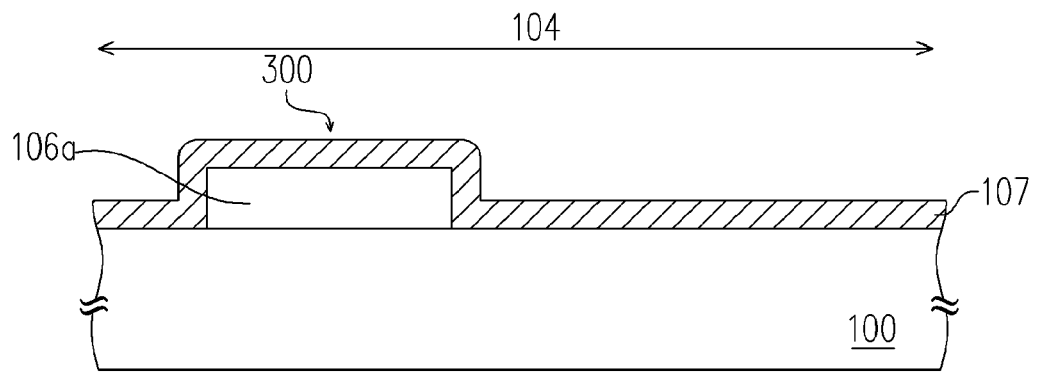
Figure 4D:
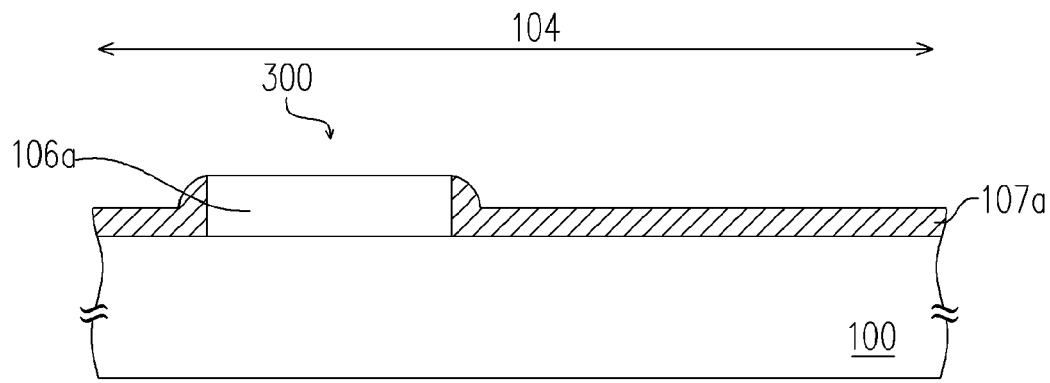

Referring to FIG. 4C, a metal layer 107 such as a tungsten layer is formed on the substrate 100 to fill in the contact hole on the chip region and to cover raised feature 300 on the overlay mark region 104. The thickness of the metal layer 107 is thinner than that of the raised feature 300. Thereafter, referring to FIG. 4D, a chemical mechanical polishing process is performed on the metal layer 107 until the patterned dielectric layer 106a is exposed. Thereby, a contact plug (not shown) is formed on the chip region, and the metal layer 107a is remained on the side wall of the first raised feature 300 and covering the substrate 100 on the overlay mark region 104. The thickness of the metal layer 107 is thinner than that of the first raised feature 300. Therefore, on the overlay mark region 104, the top surface of the remained metal layer 107a on the substrate 100 is lower than the top surface of the first raised feature 300 after performing the chemical mechanical polishing process.

Figure 4E:
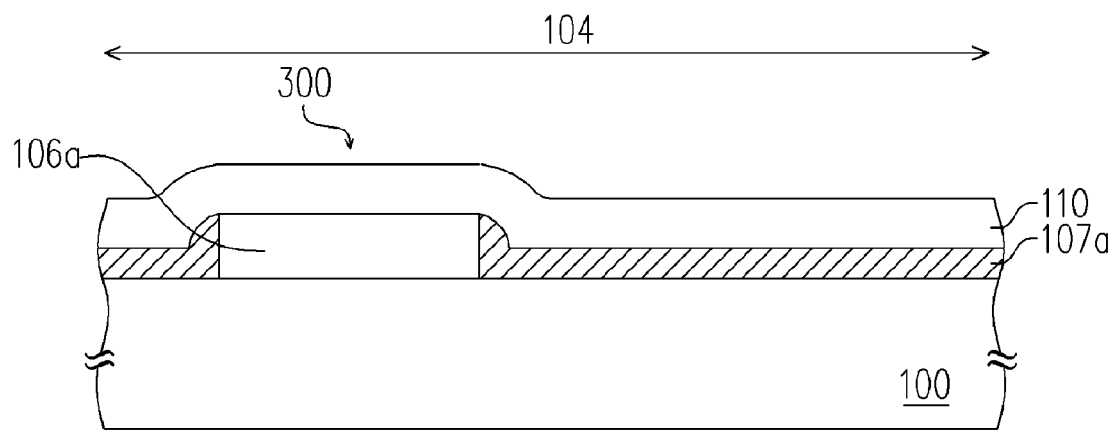

Referring to FIG. 4E, another dielectric layer 110 is formed on the substrate 100, in which a via will be formed therein in the subsequently process. In general, the dielectric layer 110 is thinner than the dielectric layer 106a. The thickness of the dielectric layer 106a, for example, is about 8000 angstrom, and the thickness of the dielectric layer 110 is about 3000 angstrom.

Figure 4F:
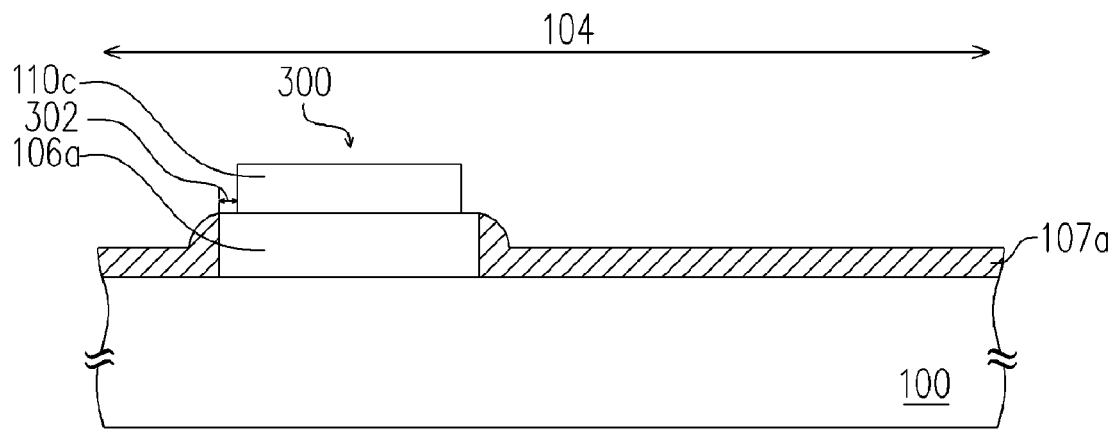

Referring to FIG. 4F, a photolithographic process and an etching process for patterning the dielectric layer 110 are conducted to form a patterned dielectric layer 110c. The portion of patterned dielectric layer 110c on the chip region of the substrate 100 has a via hole therein (not shown). The portion of the patterned dielectric layer 110c on the overlay mark region 104 is a second raised feature 310, which serves as the other portion of the outer mark. The first raised feature 300 and the second raised feature 310 compose the outer mark 320. A width of the second raised feature 310 is smaller than that of the first raised feature 300, and so that the second raised feature 310 exposes a portion of the first raised feature 300. The difference in distance 302 between a side wall of the first raised feature 300 and that of the second raised feature 310 is no less than 150 nm.

Figure 4G:
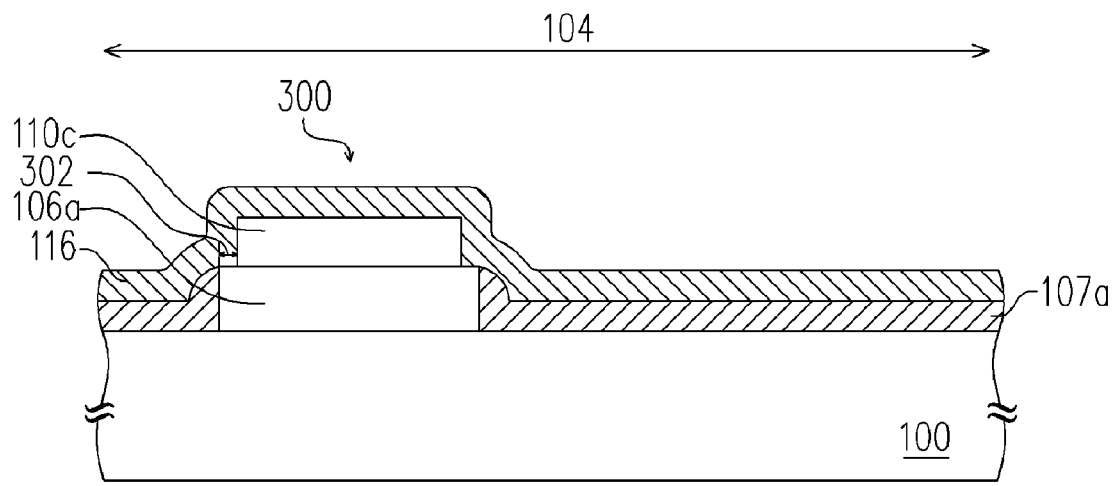

Subsequently, referring to FIG. 4G, another metal layer 116 such as a tungsten layer is formed to cover the second raised feature 310, the first feature 300 and the metal layer 107a on the overly mark region 104, and to cover the dielectric layer 110c and fill in the via hole on the chip region. In general, the thickness of the metal layer 116 is similar to that of the second raised feature 310. Therefore, on the overlay mark region 104, the top surface of the metal layer 116 on the second raised feature 310 is higher than that of the metal layer 116 on the metal layer 107a.

Figure 4H:
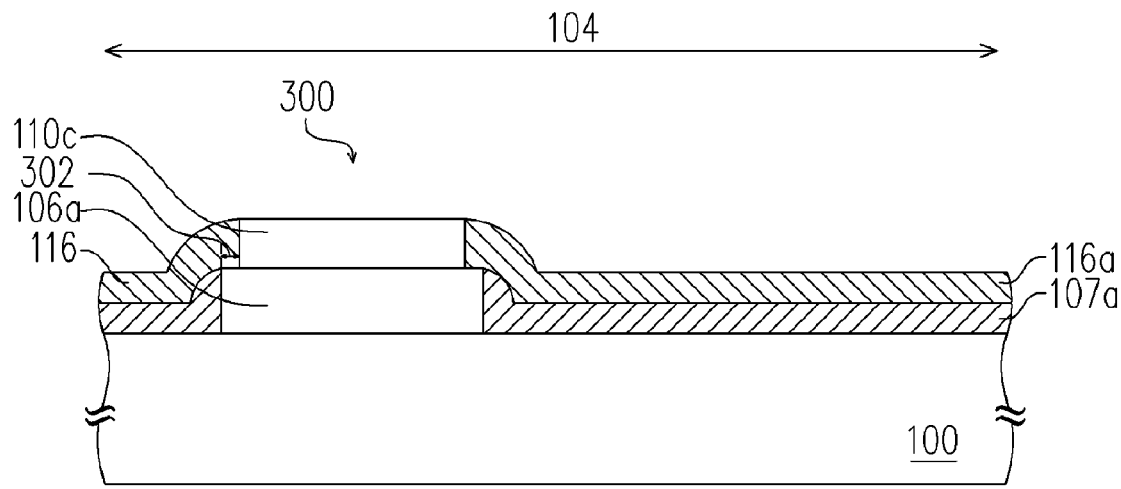

Referring to FIG. 4H, a chemical mechanical polishing process is performed on the metal layer 116 until the patterned dielectric layer 10c is exposed. Thereby, a via plug (not shown) is formed on the chip region and the metal layer 116a is retained on the side wall of the second raised feature 310 and covering the metal layer 107a on the overlay mark region 104. On the overlay mark region 104, the top surface of the remained metal layer 116a on the metal layer 107a is lower than the top surface of the second raised feature 310 after performing the chemical mechanical polishing process. In other words, a high step height is formed between the top surface of the remained metal layer 116a on the metal layer 107a and the top surface of the second raised feature 310.

Figure 4I:
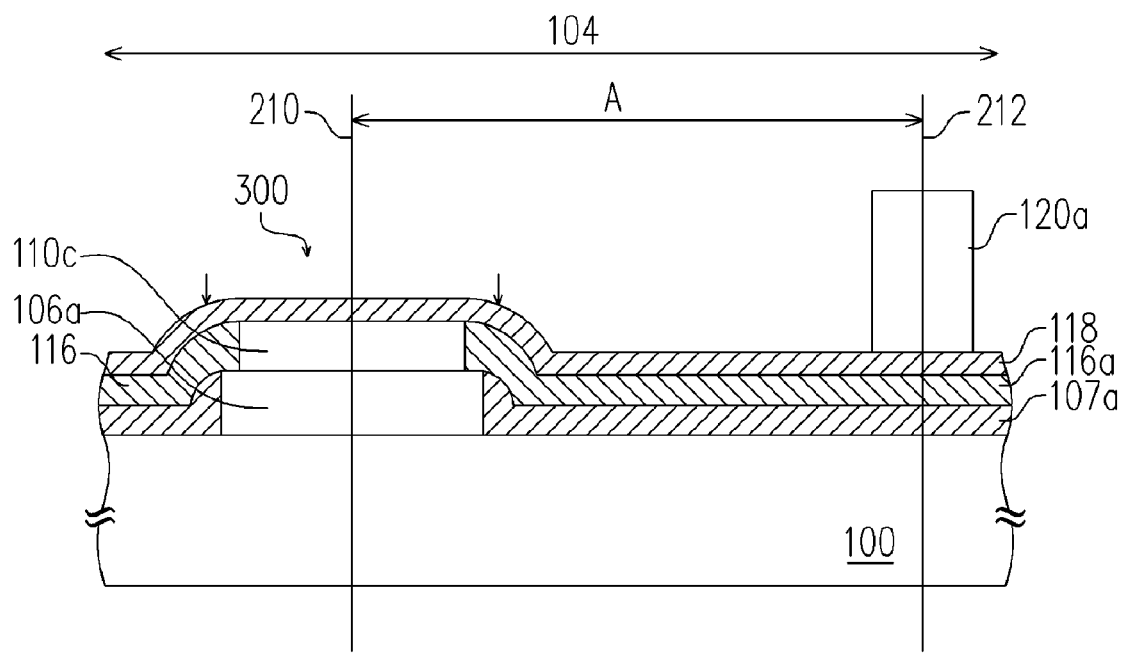

Referring to FIG. 4I, a metal layer 118 used for forming wire lines connected to the via plug on the chip region is formed on the substrate 100. Thereafter, a patterned photoresist layer 120 is formed on the metal layer 118. The portion (not shown) of the patterned photoresist layer 120 on the chip region serves as a mask for defining wire lines, and the portion of the patterned photoresist layer 120 on the overlay mark region 104 serves as an inner mark 350.

Figure 5A:
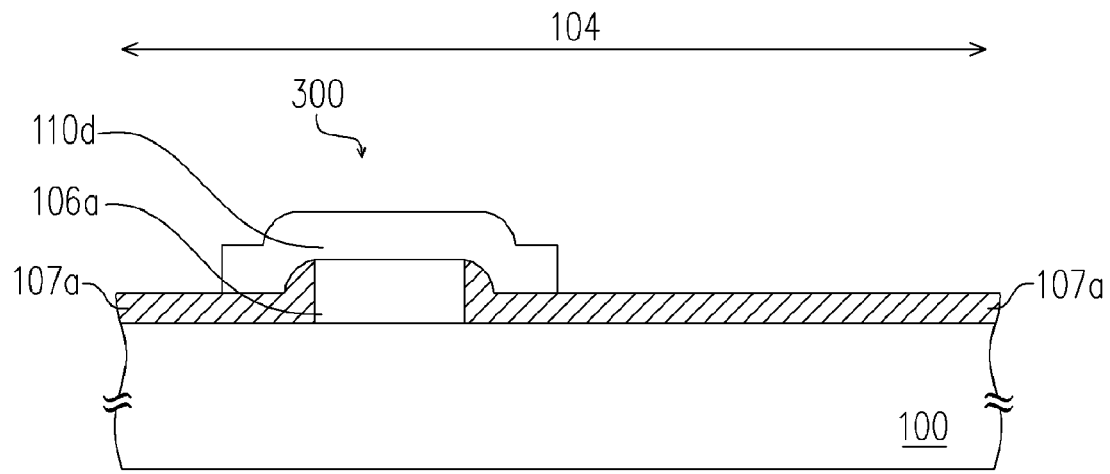
FIGS. 5A to 5D are cross sectional views illustrating a method of fabricating an overlay mark in a metal interconnect according to the second example of the second embodiment of this invention.

Another example of the second embodiment of invention is described as follows. FIG. 5A is a cross sectional view illustrating a method of fabricating an overlay mark in a metal interconnect according to the second embodiment of this invention, which is a subsequent step following FIG. 4E. Referring to FIG. 5A, a photolithographic process and an etching process for patterning the dielectric layer 110 are conducted to form a patterned dielectric layer 110d. The portion of patterned dielectric layer 110d on the chip region of the substrate 100 has a via hole therein (not shown). The portion of the patterned dielectric layer 110d on the overlay mark region 104 is a second raised feature 400, which serves as the other portion of the outer mark. The first raised feature 300 and the second raised feature 400 constitute the outer mark 420. A width of the second raised feature 400 is larger than that of the first raised feature 300, and so that the second raised feature 400 covers the first raised feature 300 and the metal layer 107a adjacent to the second raised feature 400.

Figure 5B:
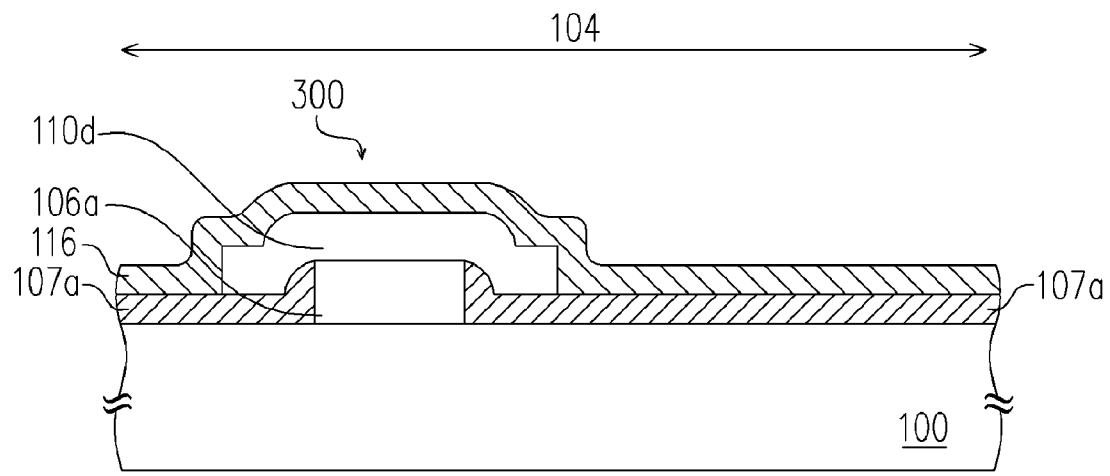

Referring to FIG. 5B, another metal layer 116 such as a tungsten layer is formed to cover the second raised feature 310 and the metal layer 107a on the overly mark region 104, and cover the dielectric layer 110d and fill in the via hole on the chip region. The thickness of the metal layer 116 is similar to that of the second raised feature 310. Therefore, on the overlay mark region 104, the top surface of the metal layer 116 on the second raised feature 400 is higher than that of the substrate 100.

Figure 5C:
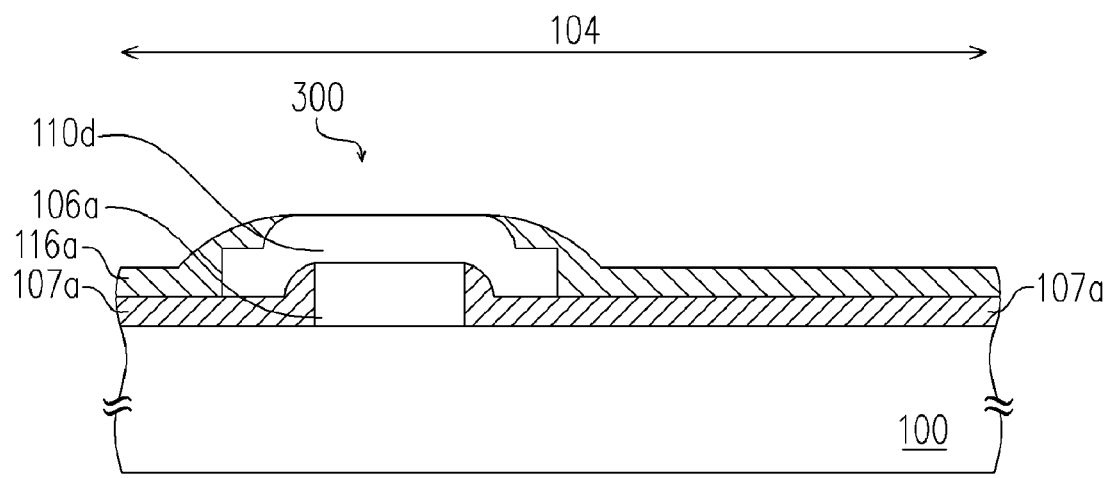

Referring to FIG. 5C, a chemical mechanical polishing process is performed on the metal layer 116 until the patterned dielectric layer 110d is exposed. Thereby, a via plug (not shown) is formed on the chip region and the metal layer 116a is retained on the side wall of the second raised feature 400 and covering the metal layer 107a on the overlay mark region 104. On the overlay mark region 104, the top surface of the remained metal layer 116a on the metal layer 107a is lower than the top surface of the second raised feature 400 after performing the chemical mechanical polishing process. In other words, a step height is formed between the top surface of the remained metal layer 116a on the metal layer 107a and the top surface of the second raised feature 400 on the overlay mark region 104.

Figure 5D:
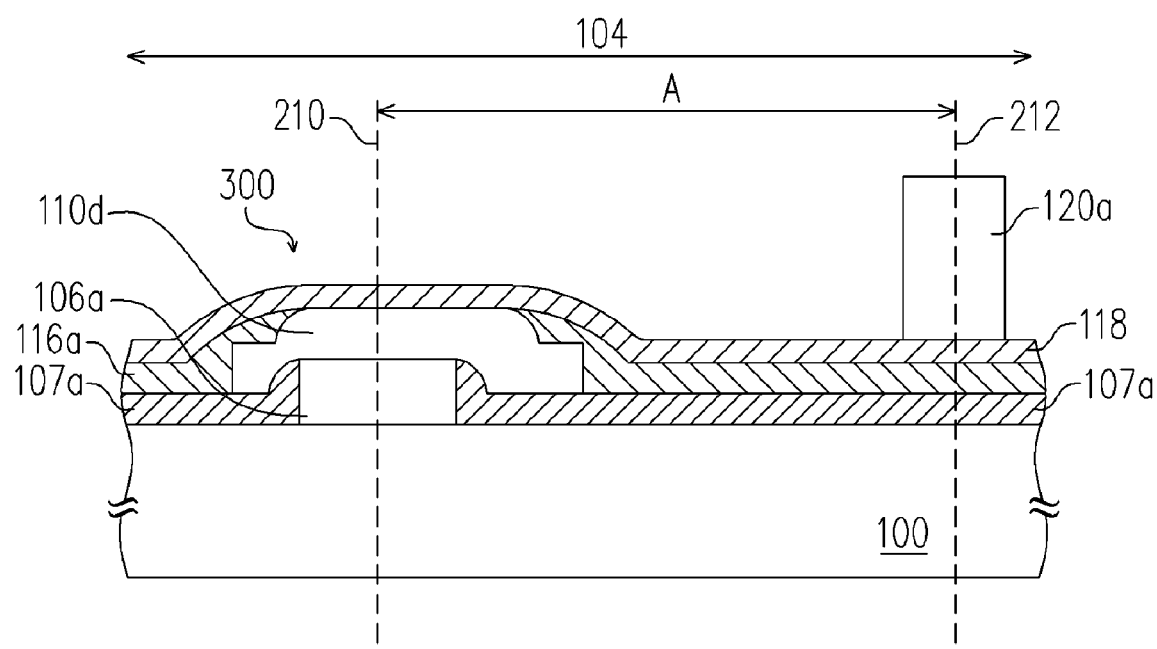

Referring to FIG. 5D, a metal layer 118 used for forming wire lines connected to the via plug on the chip region is formed on the patterned dielectric layer 110d. Thereafter, a patterned photoresist layer 120 is formed on the metal layer 118. The portion (not shown) of the patterned photoresist layer 120 on the chip region serves as a mask for defining wire lines, and the portion of the patterned photoresist layer 120 on the overlay mark region 104 serves as an inner mark 350.

Referring to FIGS. 4I and 5D, the overlay mark of this embodiment comprises a first raised feature 300, a metal layer 107a, a second raised feature 310 or 400, a metal layer 116a, a metal layer 118 and a third raised feature 350. The first raised feature 300 serves as a raised type outer mark on a substrate 100. The metal layer 107a covers a side wall of the first raised feature 300 and the substrate 100. The second raised feature 310 or 400 covers at least the first raised feature 300, wherein a thickness of the second raised feature 310 or 400 is smaller than that of the first raised feature 300. The metal layer 116a covers a side wall of the second feature 310 or 400 and the metal layer 107a. The metal layer 118 covers the second raised feature 310 or 400 and the metal layer 116a. The third raised feature 350 made of a patterned photoresist layer on the metal layer 118 serves as an inner mark. Using the overlay mark to measure the alignment accuracy, the peak signal in the center point of the outer mark, which is indicated by the dotted line 210, can be read, since the outer mark has a high step height. Moreover, the peak signal in the center point of the inner mark, which is indicated by the dotted line 212, can be read. Thereafter, the overlay error can be determined.

The above-mentioned process of fabricating overlay mark in the metal interconnect is illustrated according to preferred embodiments of the present invention, however, this is used as an example without restricting the scope of this invention. In other words, the dielectric layers 106 and 110 comprise other materials, for example, a conductive material or a silicon material. The metal layer 107, 116 and 108 comprise other material, for example, a dielectric material or a silicon material.

In this invention, the outer mark consists of two trenches or two raised features. The first trench or the first raised feature is formed by patterning the first dielectric layer for forming the contact hole. The second trench or the second raised feature is formed by patterning the second dielectric layer for forming the via hole (via 0). Since the metal layer for forming the contact plug is thinner than the first dielectric layer, a step height is formed between the remained metal layer and the dielectric layer for forming the contact hole after performing the chemical mechanical polishing process. Furthermore, the thickness of the second metal layer for forming the via 0 is similar to that of the second dielectric layer. Therefore, a high step height of the outer mark is kept after a second chemical mechanical polishing process and the problem of alignment measurement caused by low step height of the outer mark can be effectively resolved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A method of forming an overlay mark, comprising:
forming a first material layer on a substrate;
forming a first trench serving as a first potion of a trench type outer mark in the first material layer;
forming a first deposition layer on the first material layer, wherein the first trench is partially or incompletely filled with the first deposition layer;
performing a first chemical mechanical polishing process on the first deposition layer until the first material layer is exposed leaving a remaining portion of the first deposition layer in the first trench;
forming a second material layer to cover the first material layer and the first deposition layer, wherein a thickness of the second material layer is smaller than that of the first material layer;
removing the second material layer on the trench type outer mark to form a second trench exposing at least a portion of the first deposition layer in the first trench, wherein the second trench serves as a second portion of the trench type outer mark;
forming a second deposition layer on the substrate to cover the second material layer and the first deposition layer in the first trench;
performing a second chemical mechanical polishing process on the second deposition layer until the second material layer in the second trench is exposed;
forming a third deposition layer on the second material layer, wherein a step height is formed on the third deposition layer between the edge of the first trench and the center of the first trench; and
forming a raised feature serving as an inner mark on the third deposition layer.

2. The method of claim 1, wherein a width of the second trench is larger than that of the first trench, and the second trench exposes the first deposition layer in the first trench and a portion of the first material layer.

3. The method of claim 2, wherein a difference in distance between a side wall of the second trench and that of the first trench is no less than 150 nm.

4. The method of claim 1, wherein a width of the second trench is smaller than that of the first trench and the second trench exposes a portion of the first deposition layer in the first trench.

5. The method of claim 1, wherein the raised feature comprises a patterned photoresist layer.

6. The method of claim 1, wherein the first material layer and the second material layer comprise a dielectric layer respectively, and the first deposition layer, the second deposition layer and the third deposition layer comprise a metal layer respectively.

7. A method of forming an overlay mark, comprising:
forming a first material layer on a substrate;
patterning the first material layer to form a first raised feature serving as a portion of a raised type outer mark on the substrate;
forming a first deposition layer to cover the substrate and the first raised feature, wherein a thickness of the first deposition layer is thinner than that of the first material layer;
performing a first chemical mechanical polishing process on the first deposition layer until a top surface of the first raised feature is exposed;
forming a second material layer to cover the first deposition layer and the first raised feature, wherein a thickness of the second material layer is smaller than that of the first material layer;
patterning the second material layer to form a second raised feature on the first raised feature serving as the other portion of the raised type outer mark on the substrate;
forming a second deposition layer to cover the second raised feature and the first deposition layer;
performing a second chemical mechanical polishing process on the second deposition layer until a top surface of the second raised feature is exposed;
forming a third deposition layer on the second material layer, wherein a step height is formed on the third deposition layer between the edge of the second raised feature and the center of the second raised feature; and
forming a third raised feature serving as an inner mark layer on the third deposition layer.

8. The method of claim 7, wherein a width of the second raised feature is smaller than that of the first raised feature, so that the second raised feature exposes a portion of the first raised feature.

9. The method of claim 8, wherein a difference in distance between a side wall of the first raised feature and that of the second raised feature is no less than 150 nm.

10. The method of claim 7, wherein a width of the second raised feature is larger than that of the first raised feature, so that the second raised feature covers the first raised feature and a portion of the first deposition layer.

11. The method of claim 7, wherein the third raised feature comprises a patterned photoresist layer.

12. The method of claim 7, wherein the first material layer and the second material layer comprise a dielectric layer respectively, and the first deposition layer, the second deposition layer and the third deposition layer comprise a metal layer respectively.

* * * * *